(12) United States Patent
Seol et al.

(10) Patent No.: US 8,247,788 B2
(45) Date of Patent: Aug. 21, 2012

(54) NONVOLATILE MEMORY DEVICE

(75) Inventors: Kwang-soo Seol, Yongin-si (KR);
Yoon-dong Park, Yongin-si (KR);
Deok-kee Kim, Seoul (KR); Sang-jun Choi, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 232 days.

(21) Appl. No.: 12/659,175

(22) Filed: Feb. 26, 2010

(65) Prior Publication Data
US 2010/0237312 A1 Sep. 23, 2010

(30) Foreign Application Priority Data
Mar. 19, 2009 (KR) ........................ 10-2009-0023543

(51) Int. Cl.
*H01L 45/00* (2006.01)
(52) U.S. Cl. .............................. 257/2; 257/4
(58) Field of Classification Search .................. 257/1–5, 257/E45.002
See application file for complete search history.

(56) References Cited

U.S. PATENT DOCUMENTS

| 7,012,273 B2* | 3/2006 | Chen ................................. 257/4 |
| 7,276,722 B2* | 10/2007 | Gilton ............................. 257/2 |
| 2003/0223292 A1 | 12/2003 | Nejad et al. |
| 2008/0149913 A1 | 6/2008 | Tanaka et al. |

FOREIGN PATENT DOCUMENTS

| JP | 2003-229537 | 8/2003 |
| KR | 1020030060327 | 7/2003 |

* cited by examiner

*Primary Examiner* — Cuong Q Nguyen
(74) *Attorney, Agent, or Firm* — Harness, Dickey & Pierce, P.L.C.

(57) ABSTRACT

The nonvolatile memory device includes at least one pair of first electrode lines, at least one device structure disposed between the at least one pair of first electrode lines and a dielectric layer disposed between the at least one device structure and the at least one pair of first electrode lines. The at least one device structure includes a second electrode line including a first conductive type semiconductor, a resistance changing material layer adjacent to the second electrode line, a channel adjacent to the resistance changing material layer and including a second conductive type semiconductor different from the first conductive type semiconductor and a third electrode line adjacent to the channel and including the first conductive type semiconductor.

20 Claims, 7 Drawing Sheets

NONVOLATILE MEMORY DEVICE

CROSS-REFERENCE TO RELATED APPLICATION(S)

This application claims the benefit of Korean Patent Application No. 10-2009-0023543, filed on Mar. 19, 2009, in the Korean Intellectual Property Office, the disclosure of which is incorporated herein in its entirety by reference.

BACKGROUND

1. Field

Example embodiments of inventive concepts relate to a semiconductor device, for example, to a nonvolatile memory device using a resistance changing material layer.

2. Description of the Related Art

A volume of a semiconductor product is continuously decreasing, while the semiconductor product is still required to process a high capacity of data. Accordingly, an operation speed and integration of a nonvolatile memory device used in such a semiconductor product needs to be increased. Here, a nonvolatile memory device having a multilayer structure is more highly integrated than a nonvolatile memory device having a conventional monolayer structure.

By using the multilayer structure, a plurality of memory cells may be stacked perpendicularly on the same area as the monolayer structure. However, it is more difficult to connect and select memory cells in each layer in the nonvolatile memory device having the multilayer structure. Also, as the number of stacked layers increases, the number of manufacturing operations increases, thereby increasing manufacturing costs.

SUMMARY

Example embodiments of inventive concepts provide a nonvolatile memory device that may be more readily and highly integrated into an expanded to a layered structure.

According to example embodiments of inventive concepts, a nonvolatile memory device includes at least one pair of first electrode lines, at least one device structure disposed between the at least one pair of first electrode lines and a dielectric layer disposed between the at least one device structure and the at least one pair of first electrode lines. The at least one device structure includes a second electrode line including a first conductive type semiconductor, a resistance changing material layer adjacent to the second electrode line, a channel adjacent to the resistance changing material layer and including a second conductive type semiconductor different from the first conductive type semiconductor and a third electrode line adjacent to the channel and including the first conductive type semiconductor.

According to example embodiments of inventive concepts, a device structure includes a first electrode line including a first conductive type semiconductor, a resistance changing material layer adjacent to the first electrode line, a channel adjacent to the resistance changing material layer and including a second conductive type semiconductor different from the first conductive type semiconductor and a second electrode line adjacent to the channel and including the first conductive type semiconductor.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
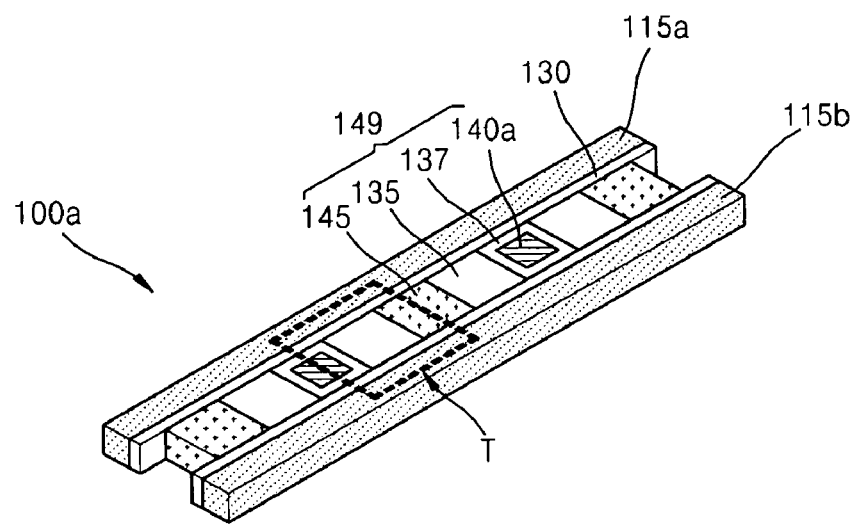
FIG. 1 is a perspective view of a partial structure of a nonvolatile memory device according to example embodiments of inventive concepts.

Hereinafter, the example embodiments will be described in detail with reference to the attached drawings.

Example embodiments may, however, have many different forms and should not be construed as being limited to those set forth herein; rather, these example embodiments are provided so that this disclosure will be thorough and complete, and will fully convey the concepts of the invention to those of ordinary skill in the art. In the drawings, the sizes and thicknesses of layers and regions are exaggerated for clarity.

It will be understood that when an element, such as a layer, a region, or a substrate, is referred to as being "on", "adjacent to", "connected to", or "coupled to" another element, it may be directly on, adjacent to, connected to, or coupled to the other element or intervening elements may be present. In contrast, when an element is referred to as being "directly on", "directly connected to" or "directly coupled to" another element, there are no intervening elements present. Like reference numerals refer to like elements throughout. As used herein, the term "and/or" includes any and all combinations of one or more of the associated listed items.

The terms "first," "second," and the like are used to describe various members, elements, regions, layers and/or parts, but these members, elements, regions, layers and/or parts are not limited by these terms. These terms are used only to distinguish one member, element, region, layer, or part from another member, element, region, layer, or part. Accordingly, a first member, element, region, layer, or part may denote a second member, element, region, layer, or part without deviating from the scope of example embodiments of inventive concepts.

Also, relative terms such as "top" or "upper" and "bottom" or "lower" may be used herein to describe a relationship between elements as illustrated in drawings. The relative terms may include other directions in additional to a direction shown in the drawings. For example, when a device is turned over in the drawings, elements that are described to exist on upper surfaces of other elements now exist on lower surfaces of the other elements. Accordingly, the term "upper" used as the example may include "lower" and "upper" directions based on a certain direction of the drawings. If a device faces another direction (90° rotation), the relative terms may be interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

FIG. 1 is a perspective view of a partial structure of a nonvolatile memory device 100a according to example embodiments of inventive concepts.

Referring to FIG. 1, a portion T indicated by a dotted line indicates a unit MOS transistor.

The nonvolatile memory device 100a may include a pair of first electrode lines 115a and 115b. The first electrode lines 115a and 115b are spaced apart from each other and may extend in parallel. However, the first electrode lines 115a and 115b may also be disposed differently. For example, the first electrode lines 115a and 115b may not be parallel to each other provided that they are not directly connected to each other. Alternatively, the first electrode lines 115a and 115b may include a parallel portion and an unparallel portion. The first electrode lines 115a and 115b may include a semiconductor doped with a dopant, or a conductor. When the first electrode lines 115a and 115b include a conductor, the first electrode lines 115a and 115b may include any one or more from the following group: tantalum (Ta), titanium (Ti), titanium nitride (TiN), tungsten (W), nickel (Ni), tantalum silicide (TaSi), tungsten silicide (WSi), titanium silicide (TiSi), molybdenum silicide (MoSi), nickel silicide (NiSi), ruthenium (Ru), ruthenium oxide (RuO), iridium (Ir), iridium oxide (IrO), and platinum(Pt).

At least one device structure 149 of the nonvolatile memory device 100a includes a second electrode line 140a, a resistance changing material layer 137, a channel body 135, and a third electrode line 145, which are sequentially arranged along the first electrode lines 115a and 115b in the order stated. The device structure 149 is disposed between the first electrode lines 115a and 115b.

The resistance changing material layer 137 is formed adjacent to the second electrode line 140a. For example, the resistance changing material layer 137 may be formed surrounding the second electrode line 140a. Alternately, the resistance changing material layer 137 may be disposed only between the second electrode line 140a and the channel body 135. If required, the resistance changing material layer 137 may be formed surrounding the third electrode line 145.

The resistance changing material layer 137, for example, may include a variable resistor. The variable resistor may be classified from a phase transition resistor as the variable resistor changes resistance without changing a state. The variable resistor may be composed of different types of resistance changing material. For example, a first type of resistance changing material may be used by preparing a binary oxide, such as a niobium oxide ($Nb_2O_5$), a titanium oxide ($TiO_2$), a nickel oxide (NiO), or an aluminum oxide ($Al_2O_3$), to have a non-stoichiometric composition. A second type of resistance changing material may be a chalcogenide compound containing GST ($GeSb_xTe_y$ or $GeSb_x$), wherein a resistance difference according to a change of threshold voltage of an Ovonic switch is used without changing a phase by flowing a high current, such as in a phase change random access memory (PRAM), but maintaining an amorphous structure. A third type of resistance changing material may be formed to change a resistance state by doping a ferroelectric material, such as a strontium titanate ($SrTiO_3$), strontium zirconia ($SrZrO_3$), with chromium (Cr) or Nb.

Alternately, the resistance changing material layer 137 may include an insulation breaking material. For example, the resistance changing material layer 137 may include an insulator, such as an oxide (silicon dioxide ($SiO_2$), hafnium dioxide ($HfO_2$), or the like), that can break insulation according to an applied voltage. Since the insulation breaking material cannot recover insulation characteristics, the nonvolatile memory device 100a may be used as a one-time program (OTP) memory. Despite such limitations, the OTP memory may be used in a product that requires a very high memory capacity.

Alternatively, the resistance changing material layer 137 may be formed of a compound of an insulation breaking material and a variable resistor. For example, the resistance changing material layer 137 may be formed of a compound, such as $NiO/SiO_2$ or $TiO_2/SiO_2$. Accordingly, a reaction between the resistance changing material layer 137 and silicon may be suppressed.

Meanwhile, the second electrode line 140a may include a first conductive type semiconductor, the channel body 135 may include a second conductive type semiconductor that is opposite of the first conductive type, and the third electrode line 145 may include another first conductive type semiconductor. The first and second conductive types may be selected from an n-type semiconductor and a p-type semiconductor. For example, according to example embodiments of inventive concepts, the second electrode line 140a may include an n-type silicon, the channel body 135 may include a p-type silicon, and the third electrode line 145 may include an n-type silicon.

A dielectric layer 130 is formed between the first electrode lines 115a and 115b and the device structures 149: The dielectric layer 130 must sufficiently reduce a leakage current between the first electrode lines 115a and 115b and the channel body 135 while maintaining a thin equivalent oxide layer thickness. Accordingly, the dielectric layer 130 may be formed of a metal oxide having a high dielectric constant. Moreover, according to circumstances, the dielectric layer 130 may be formed of a metal oxynitride having a high dielectric constant. Examples of a material used to form the dielectric layer 130 may include a silicon oxide, a silicon oxynitride, a hafnium oxide, a hafnium oxynitride, a hafnium silicone oxynitride, a zirconium oxide, a zirconium oxynitride, a zirconium silicone oxynitride, a tantalum oxide, a tantalum oxynitride, a tantalum silicone oxynitride, aluminum oxide, aluminum oxynitride, aluminum silicone oxynitride, titanium oxide, titanium oxynitride, and titanium silicone oxynitride. These example materials may be used alone or in combination of two or more of the above.

According to example embodiments of inventive concepts, a plurality of device structures 149 may be disposed between the first electrode lines 115a and 115b. Here, the plurality of device structures 149 may be repeatedly disposed adjacent to each other along an extending direction of the first electrode lines 115a and 115b. Accordingly, referring to FIG. 1, when the first electrode lines 115a and 115b extend in a right-left direction, the channel body 135, the third electrode line 145, the channel body 135, and the second electrode line 140a surrounded by the resistance changing material layer 137 may be sequentially disposed in the stated order repeatedly on right and left of the second electrode line 140a surrounded by the resistance changing material layer 137. Moreover, the dielectric layer 130 may extend along the plurality of device structures 149. Meanwhile, while the number of device structures 149 may be selected according to a length of the first electrode lines 115a and 115b, example embodiments of the inventive scope are not limited to a number thereto. Accordingly, at least one device structure 149 may be disposed between the first electrode lines 115a and 115b.

Meanwhile, although the second electrode line 140a has a square pillar shape, the shape of the second electrode line 140a is not limited thereto. For example, the second electrode line 140a may have a polygonal pillar shape or a cylindrical shape.

In the nonvolatile memory device 100a, the first electrode lines 115a and 115b may be used as a part of a pair of word lines, and the second electrode line 140a may be used as a part of a bit line. Also, the third electrode line 145 may be used as a part of a source line. Here, since the word line and the bit line are not structurally classified from each other in the nonvolatile memory device 100a, the word line and the bit line may be referred to interchangeably.

Figure 2:
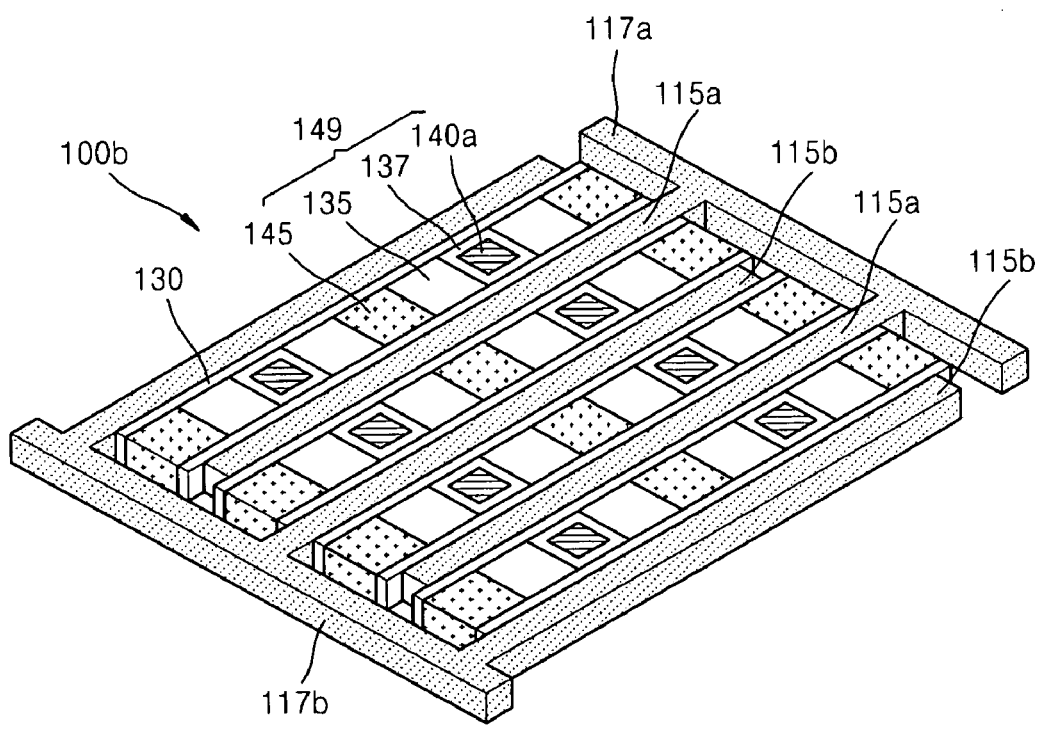
FIG. 2 a perspective view of a monolayer array structure of a nonvolatile memory device according to example embodiments of inventive concepts.

FIG. 2 a perspective view of a monolayer array structure of a nonvolatile memory device 100b according to example embodiments of inventive concepts.

Referring to FIG. 2, the first electrode lines 115a and 115b may be arranged in a two-dimensional array structure. For example, the first electrode lines 115a and 115b may be disposed as a plurality of parallel columns. For example, the nonvolatile memory device 100b may correspond to the nonvolatile memory devices 100a of FIG. 1 that are repeatedly disposed as a plurality of columns. Here, the first electrode lines 115a and 115b may be shared between the device structures 149 in different columns.

Accordingly, the first electrode lines 115a and 115b may be alternately disposed. For example, the first electrode lines 115a may be disposed in even columns, and the first electrode lines 115b may be disposed in odd columns. Alternatively, the first electrode lines 115a may be disposed in odd columns and the first electrode lines 115b may be disposed in even columns. Accordingly in example embodiments of inventive concepts, the terms odd and even have relative meanings to classify the first electrode lines 115a and 115b that are alternately disposed, and do not have absolute meanings.

A first word line 117a may electrically connect the first electrode lines 115a, and a second word line 117b may electrically connect the first electrode lines 115b. The first and second word lines 117a and 117b may be disposed separately from each other at ends of the first electrode lines 115a and 115b, respectively. For example, the first word line 117a may be connected to one of the ends of the first electrode lines 115a, and the second word line 117b may be connected to one of the ends of the first electrode lines 115b, where the ends of the first electrode lines 115a and the first electrode lines 115b are opposite to each other.

As described above, the first electrode lines 115a may be a part of the first word line 117a. Similarly, the first electrode lines 115b may be a part of the second word line 117b.

The selecting of the first electrode lines 115a and 115b in the nonvolatile memory device 100b may be performed by selecting one of the first word line 117a and the second word line 117b. Here, the device structures 149 disposed in different columns may be independently selected.

Figure 3:
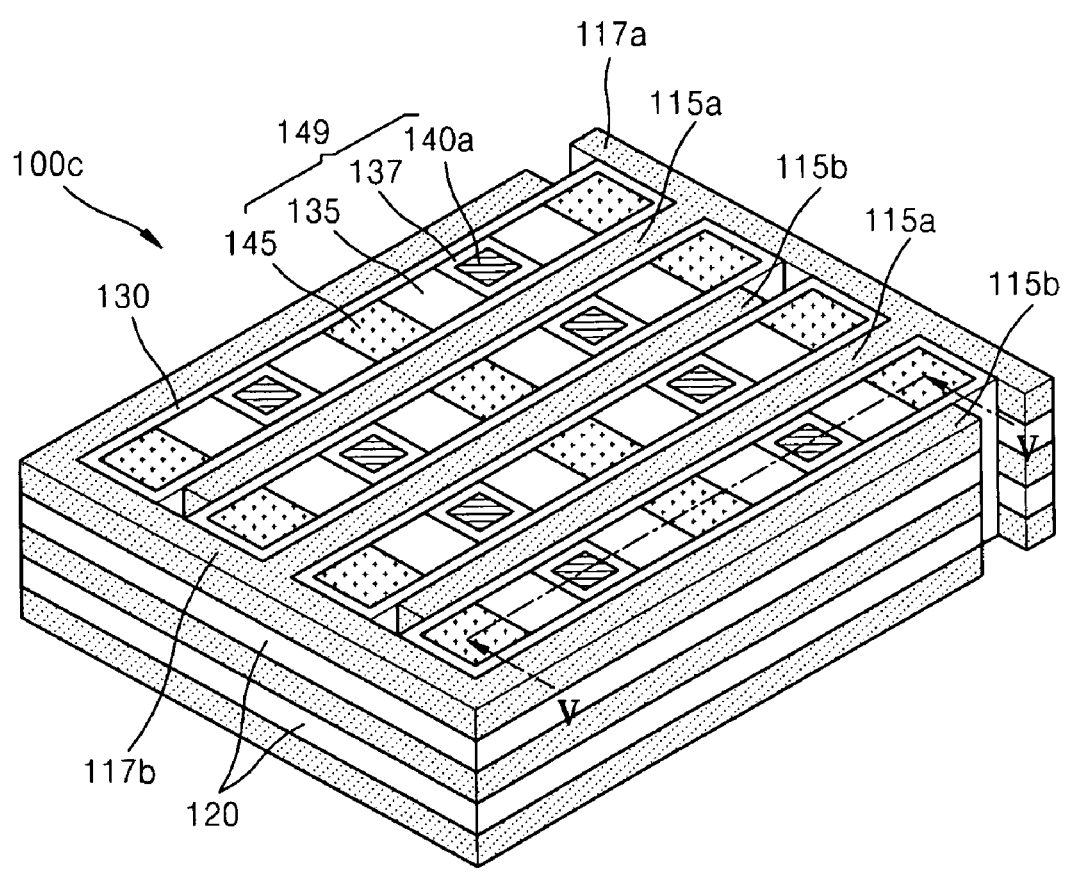
FIG. 3 is a perspective view of a layered structure of a nonvolatile memory device according to example embodiments of inventive concepts.
Figure 4:
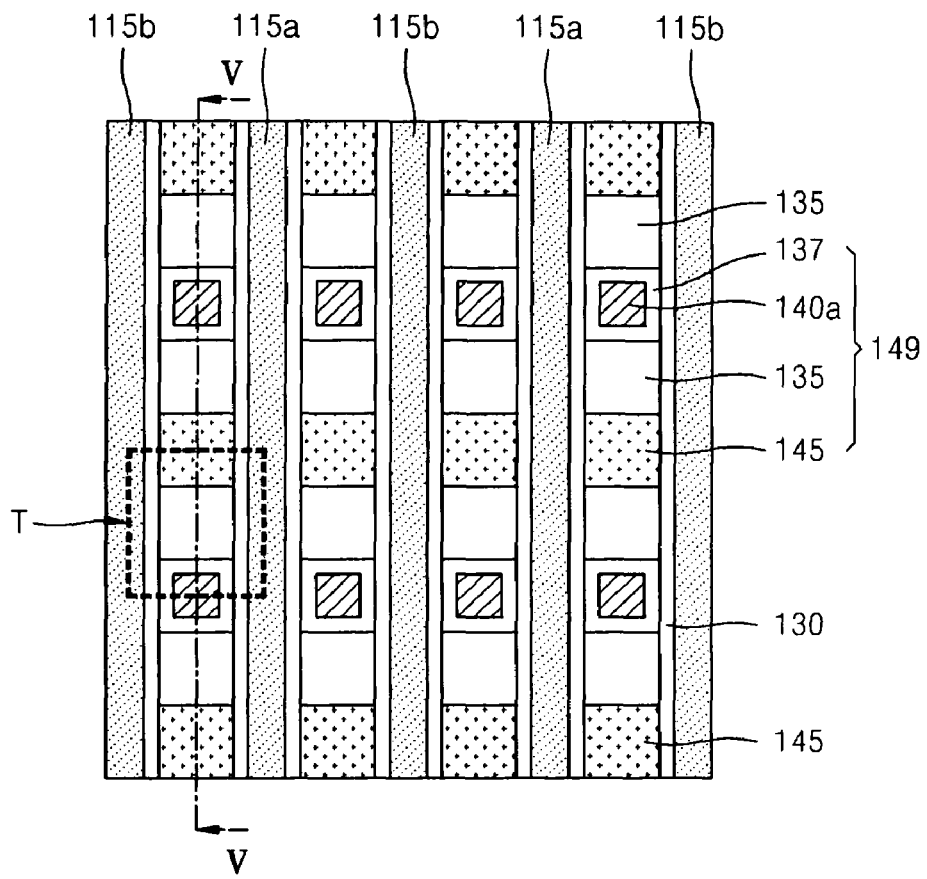
FIG. 4 is partial plan view of the layered structure of the nonvolatile memory device of FIG. 3.
Figure 5:
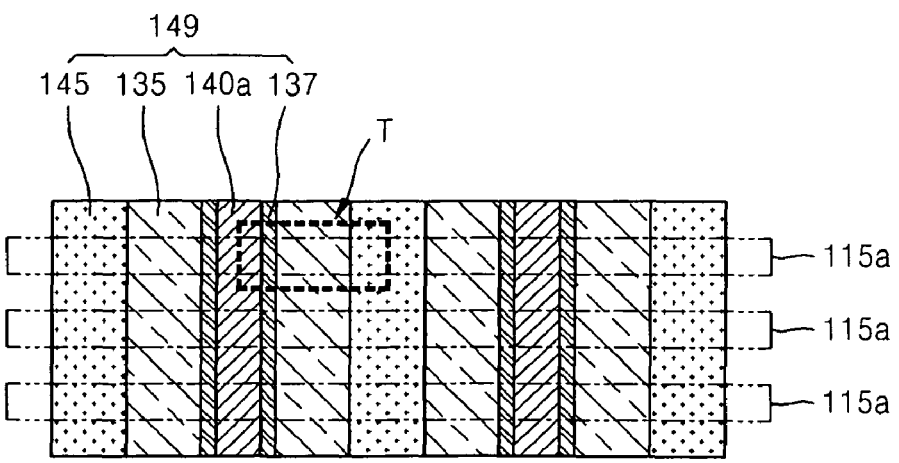
FIG. 5 is a cross-sectional view of the layered structure of the nonvolatile memory device of FIG. 3 taken along a line V-V.

FIG. 3 is a perspective view of a layered structure of a nonvolatile memory device 100c according to example embodiments of inventive concepts. FIG. 4 is partial plan view of the layered structure of the nonvolatile memory device 100c of FIG. 3. FIG. 5 is a cross-sectional view of the layered structure of the nonvolatile memory device 100c of FIG. 3 taken along a line V-V.

Referring to FIGS. 3 through 5, the nonvolatile memory device 100b of FIG. 2 may be stacked in a plurality of layers. For example, a plurality of pairs of first electrode lines 115a and 115b may be stacked in a plurality of layers. Similar to the first electrode lines 115a and 115b, a plurality of pairs of the first and second word lines 117a and 117b may be stacked in a plurality of layers. Here, an insulation layer 120 may be disposed between the plurality of layers of the first electrode lines 115a and 115b so as to electrically insulate each of the layers of the first electrode lines 115a and 115b. Accordingly, the first electrode lines 115a and 115b and the first and second word lines 117a and 117b in different layers may be separated from each other.

The device structures 149 may extend perpendicularly along side walls of the first electrode lines 115a and 115b that are stacked in the plurality of layers. Accordingly, the device structures 149 may be shared between the first electrode lines 115a and/or 115b that are disposed in different layers. Even when the device structures 149 are shared, since the first electrode lines 115a and 115b are separated from each other, memory cells disposed in the plurality of layers may separately operate. The dielectric layers 130 may perpendicularly extend along the side walls of the first electrode lines 115a and 115b that are stacked in the plurality of layers.

Referring to FIGS. 4 and 5, the portion T indicated by the dashed line denotes a unit MOS transistor.

The nonvolatile memory device 100c illustrated in FIGS. 3 through 5 has a memory structure in which a memory cell structure including one selection transistor and a resistance changer in relation with a resistance changing memory is repeated in three dimensions (3D). For example, the nonvolatile memory device 100c has a resistance changing memory structure including a pair of bit lines in a perpendicular direction, a word line in a horizontal direction and a selection transistor that are formed according to a layer, and a resistance changer formed in parallel with the bit lines.

A selection MOS transistor and resistance changer (1T-1R) structure or a selection diode and resistance changer (1D-1R) structure on a plane type structure has a limitation in terms of high capacity, and thus the 1D-1R structure having a cross-point structure may be considered first. However, in the 1D-1R structure, the resistance changer is selected by using the selection diode, and thus a diode leakage current of a memory cell may easily flow into another memory cell that is selected to read a programming state. Accordingly, the number of memory cells for sharing the same word line or the same bit line is limited. Consequently, a resistance changing memory having a 3D multilayer memory structure having a transistor and a resistance changer (1T-1R) is provided so as to prevent the inflow of a diode leakage current and achieve high capacity.

FIGS. 6 through 11 are cross-sectional views and equivalent circuits for describing operations of the nonvolatile memory device 100c of FIG. 3. For convenience of description, it is assumed that the second electrode lines 140a and the third electrode lines 145 include n-type semiconductors and the channel bodies 135 include p-type semiconductors.

Figure 6:
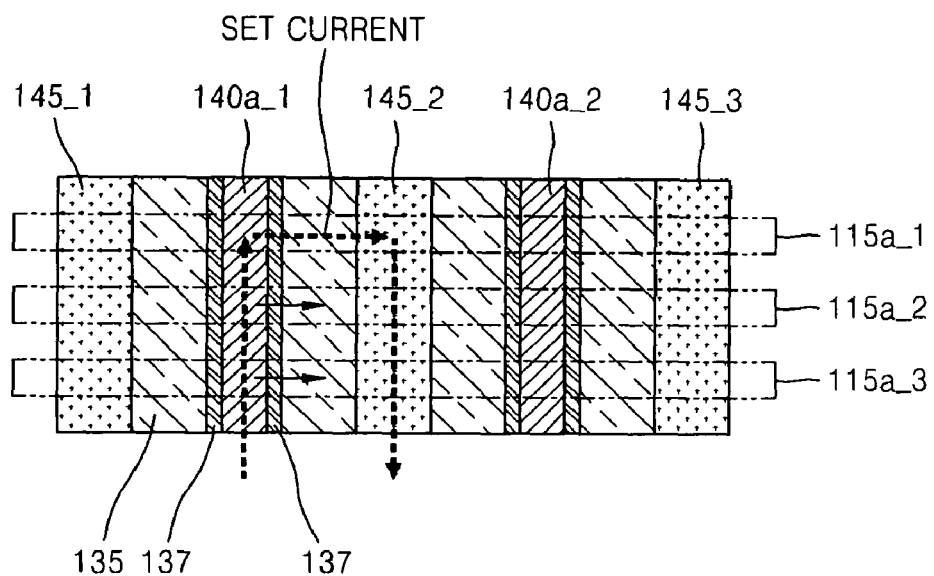
FIG. 6 is a cross-sectional view for describing a programming operation of a nonvolatile memory device, according to example embodiments of inventive concepts.
Figure 7:
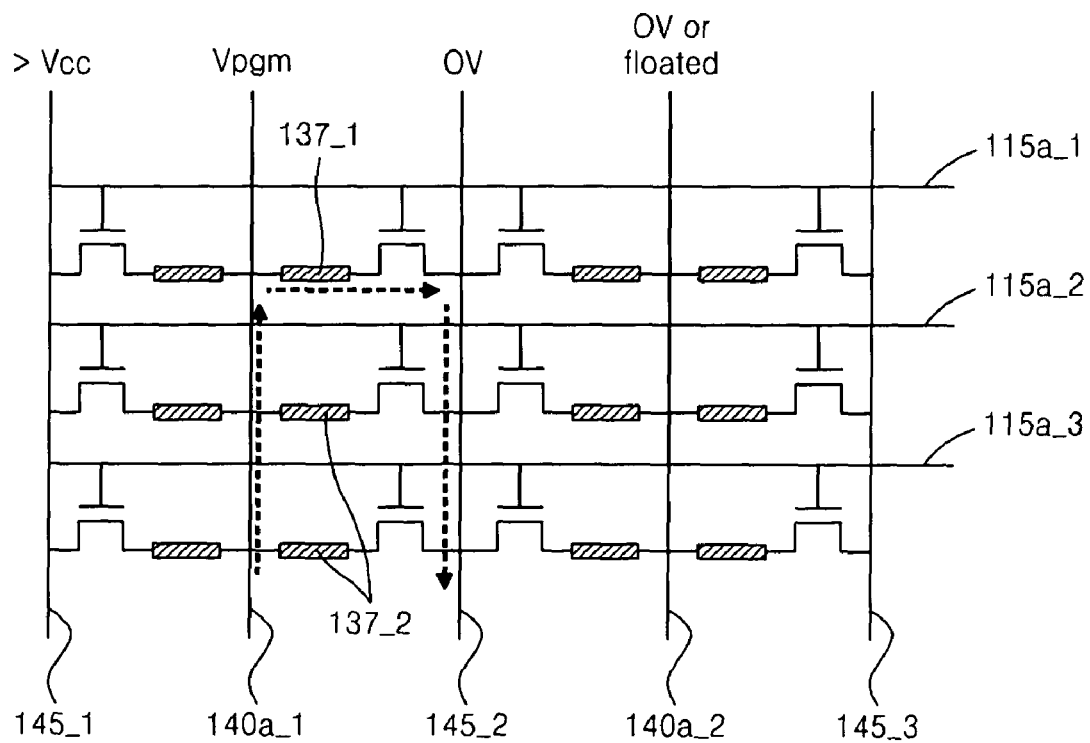
FIG. 7 is an equivalent circuit diagram of FIG. 6.

FIG. 6 is a cross-sectional view for describing a programming operation of the nonvolatile memory device 100c, according to example embodiments of inventive concepts, and FIG. 7 is an equivalent circuit diagram of the nonvolatile memory device of FIG. 6, illustrating the program operation of the nonvolatile memory device.

Referring to FIGS. 6 and 7, in order to perform a programming operation on a predetermined selected memory cell, a programming voltage (Vpgm) in a forward direction is supplied only to the resistance changing material layer 137 of the selected memory cell. Accordingly, a voltage larger than a predetermined voltage Vcc is supplied to a first electrode line 115a_1 selected from among first electrode lines 115a_1 through 115a_3, and a voltage of 0 volt (V) is supplied to remaining unselected first electrode lines 115a_2 and 115a_3, or the remaining unselected first electrode lines 115a_2 and 115a_3 are floated. Also, the programming voltage Vpgm is supplied to a second electrode line 140a_1 selected from among second electrode lines 140a_1 and 140a_2, and a voltage of 0 V is supplied to an unselected second electrode line 140a_2 or the unselected second electrode line 140a_2 is floated. Also, a voltage of 0 V is supplied to a third electrode line 145_2 selected from among third electrode lines 145_1 through 145_3, and a voltage larger than the predetermined voltage Vcc is supplied to remaining unselected third electrode lines 145_1 and 145_3.

Accordingly, a resistance changing material 137_1 selected by the first electrode line 115a_1 and the second electrode line 140a_1 turns into a low resistance state, while a set current flows through the resistance changing material layer 137_1. However, a reverse bias is formed in resistance changing material layers 137_2 crossing the unselected first electrode lines 115a_2 and 115a_3, from among resistance changing material layers 137_1 and 137_2 surrounding the selected second electrode line 140a_1, and thus the set current does not flow through the resistance changing material layers 137_2.

Meanwhile, the set current is adjusted by adjusting a voltage of the first electrode line 115a_1, and when a selected memory cell does not have compliance, the selected memory cell turns into a set state, e.g. a low resistance state, after the programming operation, and a current flowing through the selected memory cell increases. Accordingly, the selected memory cell turns into a reset state and is not programmed.

Figure 8:
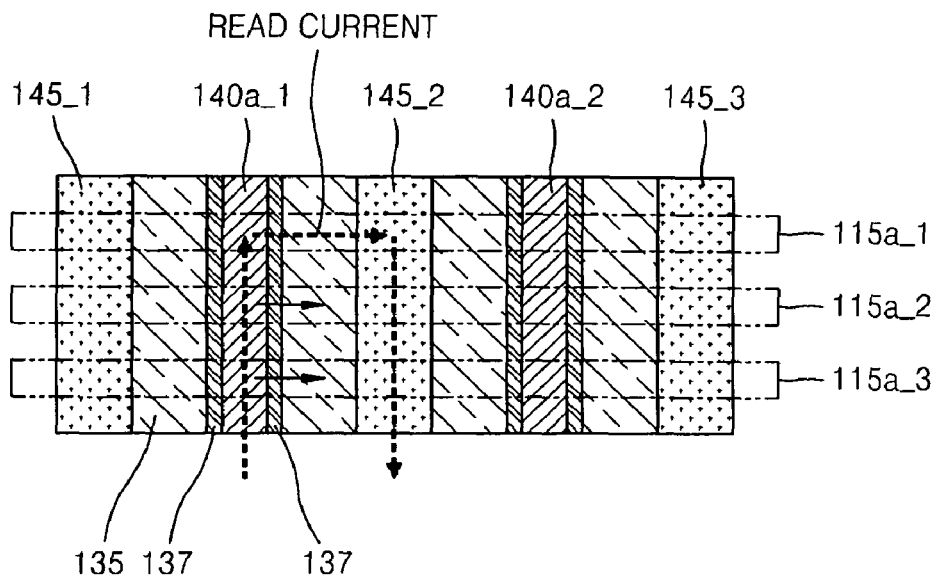
FIG. 8 is a cross-sectional diagram for describing a data read operation of a nonvolatile memory device, according to example embodiments of inventive concepts.
Figure 9:
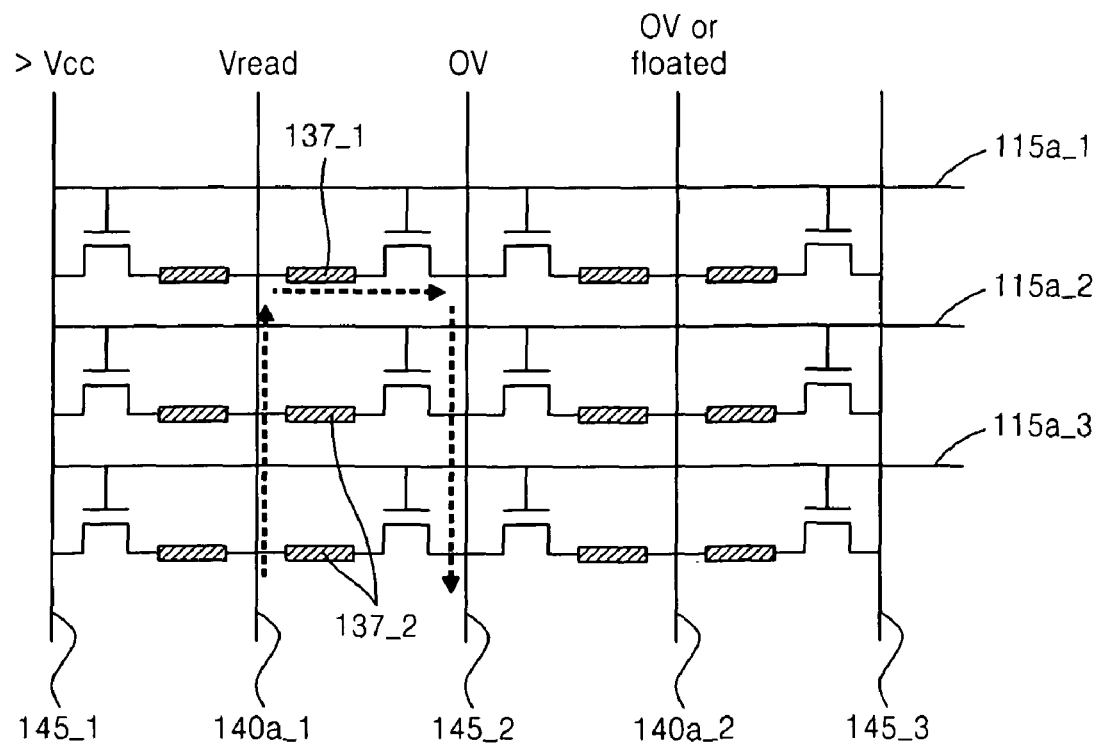
FIG. 9 is an equivalent circuit diagram of FIG. 8.

FIG. 8 is a cross-sectional diagram for describing a data read operation of the nonvolatile memory device 100c, according to example embodiments of inventive concepts. FIG. 9 is an equivalent circuit diagram of the nonvolatile memory device of FIG. 8, illustrating the read operation of the nonvolatile memory device.

Referring to FIGS. 8 and 9, in order to perform a data read operation on a predetermined selected memory cell, a data read voltage (Vread) in a forward direction is supplied only to the resistance changing material layer 137 of the selected memory cell. Accordingly, a voltage larger than a predetermined voltage Vcc is supplied to a first electrode line 115a_1 selected from among first electrode lines 115a_1 through 115a_3, and a voltage of 0 V is supplied to remaining unselected first electrode lines 115a_2 and 115a_3, or the remaining unselected first electrode lines 115a_2 and 115a_3 are floated. Also, the data read voltage Vread is supplied to a second electrode line 140a_1 selected from among second electrode lines 140a_1 and 140a_2, and a voltage of 0 V is supplied to an unselected second electrode line 140a_2 or the unselected second electrode line 140a_2 is floated. Also, a voltage of 0 V is supplied to a third electrode line 145_2 selected from among third electrode lines 145_1 through 145_3, and a voltage larger than the predetermined voltage Vcc is supplied to remaining unselected third electrode lines 145_1 and 145_3.

Accordingly, a read current flows through the resistance changing material 137_1 selected by the first electrode line 115a_1 and the second electrode line 140a_1. However, a reverse bias is formed in resistance changing material layers 137_2 crossing the unselected first electrode lines 115a_2 and 115a_3, from among resistance changing material layers 137_1 and 137_2 surrounding the selected second electrode line 140a_1, and thus the read current does not flow through the resistance changing material layers 137_2.

Figure 10:
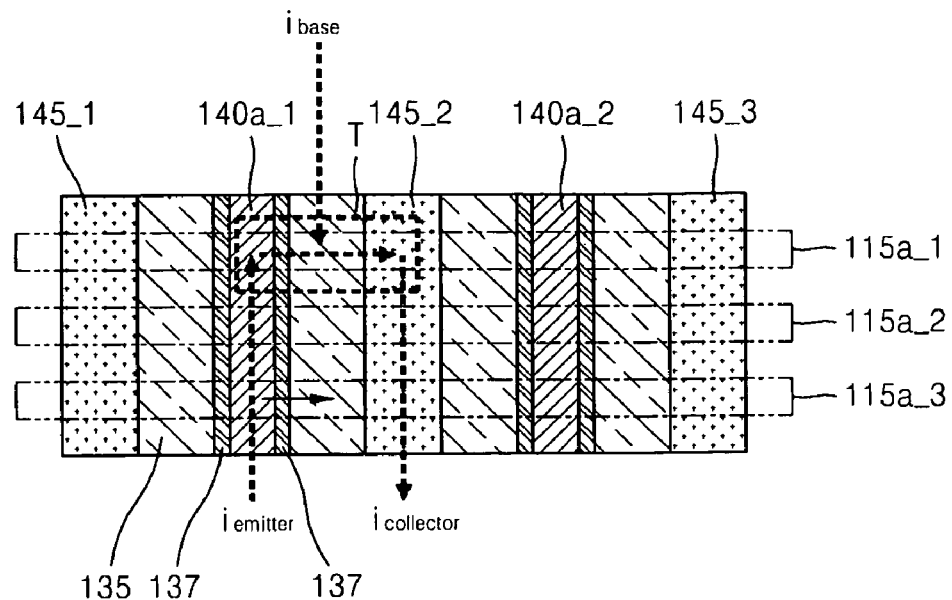
FIG. 10 is a cross-sectional diagram for describing a data erase operation of a nonvolatile memory device, according to example embodiments of inventive concepts.
Figure 11:
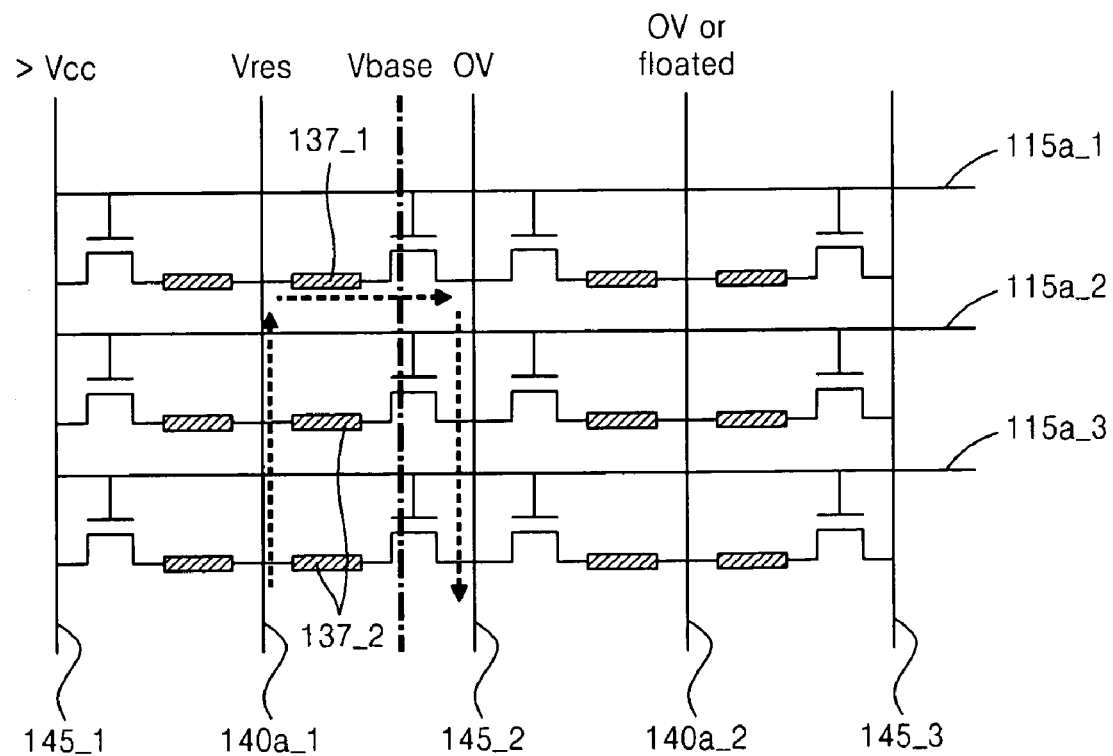
FIG. 11 is an equivalent circuit diagram of FIG. 10.

FIG. 10 is a cross-sectional diagram for describing a data erase operation of the nonvolatile memory device 100c, according to example embodiments of inventive concepts. FIG. 11 is an equivalent circuit diagram of the nonvolatile memory device of FIG. 10, illustrating the data erase operation of the nonvolatile memory device.

Referring to FIGS. 10 and 11, in order to perform a data erase operation on a selected memory cell, a reset current flows only through the resistance changing material layer 137 of the selected memory cell. Accordingly, a data erase voltage Vres is supplied to a second electrode line 140a_1 selected from among second electrode lines 140a_1 and 140a_2, and a voltage of 0 V is supplied to a remaining unselected second electrode line 140a_2, or the remaining unselected second electrode line 140a_2 is floated. Also, a voltage of 0 V is supplied to a third electrode line 145_2 selected from among third electrode lines 145_1 through 145_3. Also, when a base voltage Vbase is supplied to the channel body 135 of the selected memory cell, the channel body 135 operates as a bipolar transistor. For example, under the above condition, an emitter current Iemitter flows through the second electrode line 140a_1, a base current Ibase flows through the channel body 135, and a collector current Icollector flows through the third electrode line 145_2. Here, the base current Ibase is controlled so that a reset current required to change the selected memory cell from a set state to a reset state (a high resistance state, i.e. an off state) flows through the selected memory cell.

Although not illustrated, a sector plane on which the programming/data read/data erase operation is to be performed may be selected by using a Y-decoder, and then the programming/data read/data erase operation may be performed by using an X-decoder for selecting a second electrode line, such as a bit line, corresponding to a memory cell that is to be programmed/read/erased, and a Z-decoder for selecting a first electrode line, such as a word line, corresponding to the memory cell.

The operation mechanisms described above are applied to the nonvolatile memory device 100c of FIG. 3. The nonvolatile memory device 100c includes the plurality of pairs of first electrode lines 115a and 115b stacked in a plurality of layers, wherein the first electrode lines 115a and 115b of the layers are electrically separated from each other by the insulation layers 120. Accordingly, the operation mechanisms applied to the nonvolatile memory device 100c may also be applied to the nonvolatile memory devices 100a of FIGS. 1 and 100b of FIG. 2.

Figure 12:
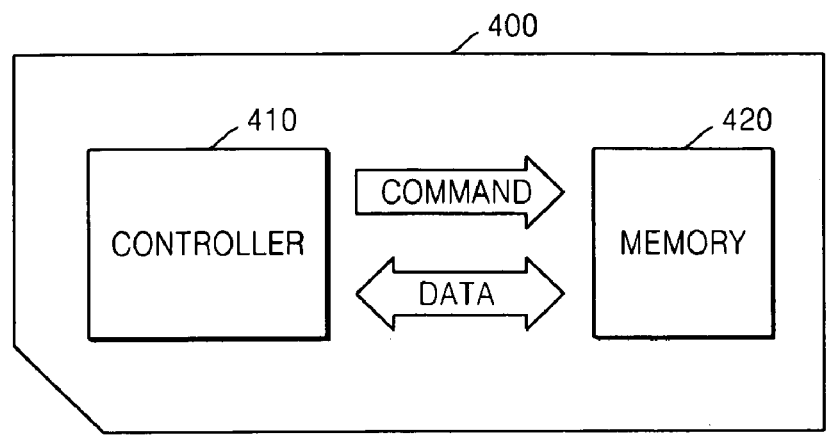
FIG. 12 is a diagram schematically illustrating a card according to example embodiments of inventive concepts.

FIG. 12 is a diagram schematically illustrating a card 400 according to example embodiments of inventive concepts.

Referring to FIG. 12, a controller 410 and a memory 420 may be disposed to exchange electric signals. For example, the memory 420 and the controller 410 may transfer data with each other according to a command of the controller 410. Accordingly, the card 400 may store data in the memory 420 or output data from the memory 420.

The memory 420 may include one of the nonvolatile memory devices 100a through 100c. However, a type of memory device used as the memory 420 is not limited thereto, and may be a dynamic random access memory (DRAM), a static random access memory (SRAM), a flash memory, a phase change RAM (PRAM), or the like.

The card 400 may be used for different mobile electronic devices, such as a multi media card (MMC) and a secure digital (SD) card.

Figure 13:
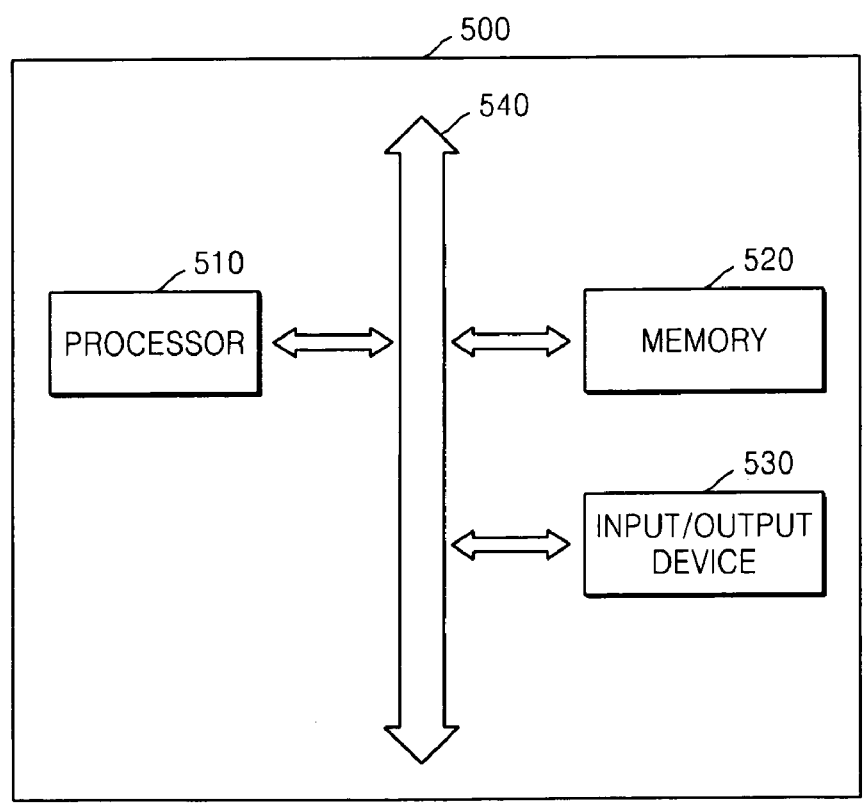
FIG. 13 is a diagram illustrating a system according to example embodiments of inventive concepts.

FIG. 13 is a diagram illustrating a system 500 according to example embodiments of inventive concepts.

Referring to FIG. 13, a processor 510, an input/output device 530, and a memory 520 may communicate with each other by using a bus 540. The processor 510 may execute a program and control the system 500. The input/output device 530 may input or output data of the system 500. The system 500 may be connected to an external device, such as a personal computer or a network, via the input/output device 530 so as to exchange data with the external device.

The memory 520 may store a code or data for operation of the processor 510. The memory 520 may include one of the nonvolatile memory devices 100a through 100c. However, a type of memory device used as the memory 520 is not limited thereto, and may include a DRAM, SRAM, a flash memory, a PRAM, or the like.

For example, the system 500 may be used in different mobile electronic devices, such as mobile phones, MP3 players, navigation, solid state disks (SSDs), and household appliances.

A nonvolatile memory device according to example embodiments of inventive concepts may be readily expanded to a layered structure. Accordingly, the nonvolatile memory device according to example embodiments of inventive concepts may have a high capacity and may be highly integrated by increasing the number of stacked memory cells, e.g. the number of stacked first electrode lines. Thus, the nonvolatile memory device according to example embodiments of inventive concepts is suitable for a highly integrated product having high capacity.

While example embodiments of inventive concepts has been particularly shown and described with reference to exemplary embodiments thereof, it will be understood that various changes in form and details may be made therein without departing from the spirit and scope of the following claims.

What is claimed is:

1. A nonvolatile memory device comprising:
    at least one pair of first electrode lines;
    at least one device structure disposed between the at least one pair of first electrode lines; and
    a dielectric layer disposed between the at least one device structure and the at least one pair of first electrode lines, wherein
    the at least one device structure includes,
        a second electrode line including a first conductive type semiconductor,
        a resistance changing material layer adjacent to the second electrode line,
        a channel adjacent to the resistance changing material layer and including a second conductive type semiconductor different from the first conductive type semiconductor; and
        a third electrode line adjacent to the channel and including the first conductive type semiconductor.

2. The nonvolatile memory device of claim 1, wherein the first conductive type semiconductor and the second conductive type semiconductor are one of an n-type semiconductor and a p-type semiconductor.

3. The nonvolatile memory device of claim 1, wherein the at least one device structure includes a plurality of device structures, where each of the device structures is adjacent to at least an other of the device structures.

4. The nonvolatile memory device of claim 3, wherein the dielectric layer extends along the plurality of device structures.

5. The nonvolatile memory device of claim 1, wherein the at least one pair of first electrode lines includes one of a semiconductor and a conductor.

6. The nonvolatile memory device of claim 1, wherein,
    the at least one pair of first electrode lines includes a plurality of first electrode lines arranged in parallel, and
    the at least one device structure includes a plurality of device structures disposed between the plurality of first electrode lines.

7. The nonvolatile memory device of claim 6, further comprising:
    a first word line electrically connecting even first electrode lines from among the plurality of first electrode lines; and
    a second word line electrically connecting odd first electrode lines from among the plurality of first electrode lines.

8. The nonvolatile memory device of claim 7, wherein the first word line and the second word line are arranged separate from each other at corresponding ends of the even and odd first electrode lines.

9. The nonvolatile memory device of claim 1, wherein the at least one pair of first electrode lines includes a plurality of pairs of first electrode lines stacked in a plurality of layers.

10. The nonvolatile memory device of claim 9, wherein the dielectric layer and the at least one device structure extend perpendicularly along the plurality of pairs of first electrode lines of the layers.

11. A device structure comprising:
    a first electrode line including a first conductive type semiconductor;

a channel adjacent to the first electrode line and including a second conductive type semiconductor different from the first conductive type semiconductor;

a second electrode line adjacent to the channel and including the first conductive type semiconductor; and a resistance changing material layer adjacent to the first electrode line, the resistance changing material layer being between the second electrode line and the channel.

12. A nonvolatile memory device, comprising:

at least one of the device structures of claim 11; and at least one pair of third electrode lines, wherein the at least one device structure is disposed between the at least one pair of third electrode lines.

13. The nonvolatile memory device of claim 12, further comprising:

a dielectric layer disposed between the at least one device structure and the at least one pair of third electrode lines.

14. A nonvolatile memory device, comprising:

a plurality of the device structures of claim 11 disposed to form a two-dimensional array; and a plurality of pairs of third electrode lines, wherein the plurality of device structures are disposed between the plurality of pairs of third electrode lines, and the plurality of pairs of third electrode lines are disposed as a plurality of columns in the two-dimensional array.

15. The nonvolatile memory device of claim 14, further comprising:

a dielectric layer disposed between the plurality of device structures and the plurality of pairs of third electrode lines.

16. The nonvolatile memory device of claim 14, further comprising:

a first word line connected to one of the pair of third electrode lines for each of the plurality of pairs of third electrode lines; and a second word line separate from the from the first word line connected to an other of the pair of third electrode lines for each of the plurality of pairs of third electrode lines.

17. A nonvolatile memory device, comprising:

a plurality of the device structures of claim 14 stacked in a plurality of layers to form a three-dimensional array.

18. The nonvolatile memory device of 17, further comprising:

at least one insulation layer disposed between the plurality of layers of the plurality of pairs of third electrode lines.

19. The nonvolatile memory device of claim 17, further comprising:

a dielectric layer disposed between the plurality of device structures and the plurality of pairs of third electrode lines.

20. The nonvolatile memory device of claim 17, further comprising:

a first word line connected to one of the pair of third electrode lines for each of the plurality of pairs of third electrode lines; and a second word line separate from the from the first word line connected to an other of the pair of third electrode lines for each of the plurality of pairs of third electrode lines.

* * * * *